United States Patent
Chua et al.

(10) Patent No.: US 6,424,047 B1
(45) Date of Patent: Jul. 23, 2002

(54) PLASTIC BALL GRID ARRAY PACKAGE FOR PASSING JEDEC LEVEL 1 MOISTURE SENSITIVITY TEST

(75) Inventors: Teo Yong Chua; Wong Ee Hua; Teo Poi Siong, all of Singapore (SG)

(73) Assignee: Institute of Microelectronics (SG)

( * ) Notice: Subject to any disclaimer, the term of this patent is extended or adjusted under 35 U.S.C. 154(b) by 0 days.

(21) Appl. No.: 09/311,549

(22) Filed: May 13, 1999

(30) Foreign Application Priority Data

Feb. 23, 1999 (SG) .............................................. 9900918

(51) Int. Cl.⁷ .............................................. H01L 23/48
(52) U.S. Cl. ........................ 257/773; 257/783; 257/786; 257/787
(58) Field of Search ................................ 257/678, 700, 257/701, 773, 777, 779, 781, 784, 782, 783, 786, 787; 174/52.2, 52.3

(56) References Cited

U.S. PATENT DOCUMENTS

| | | | |
|---|---|---|---|
| 5,721,450 A | 2/1998 | Miles .......................... | 257/667 |
| 5,756,380 A | * 5/1998 | Berg et al. ................... | 438/126 |
| 5,841,191 A | 11/1998 | Chia et al. ................... | 257/692 |

FOREIGN PATENT DOCUMENTS

| | | | |
|---|---|---|---|
| EP | 0 573 297 A2 | | 12/1993 |
| EP | 0 863 549 A2 | | 9/1998 |
| JP | 3-212965 | * | 9/1991 |
| JP | 9-223767 | * | 8/1997 |
| JP | 10-51110 | * | 2/1998 |
| JP | 11-176973 | * | 7/1999 |
| JP | 11-260954 | * | 9/1999 |
| JP | 200058563 | * | 2/2000 |

OTHER PUBLICATIONS

EIA/JEDEC Standard, *Moisture–Induced Stress Sensitivity for Plastic Surface Mount Devices*, Nov. 1995, pp. 1–12.
Chun et al., *Reduction of Popcorning in BGAs by Plasma Cleaning*, Unknown source, pp. 247–251.
Ahn et al., Popcorn Phenomena in a Ball Grid Array Package, IEEE, 1995, pp. 491–495.
Chakravorty et al., Adhesion Enhancement in BGA Packaging, The 2nd International Symposium on Electronic Packaging Technology, Dec. 1996, Shanghai, China, pp. 306–312.
Kim, Samuel, The Role of Plastic Package Adhesion in IC Performance, IEEE 1991, pp. 750–758.
Five page article entitled "Reduction of Popcorning in BGAs by Plasma Cleaning" by D.S. Chun and D.A. Doane, 2$^{nd}$ Pan Pacific Microelectronics Symposium, Jan. 1997.

* cited by examiner

*Primary Examiner*—David L. Talbott
*Assistant Examiner*—Alonzo Chambliss
(74) *Attorney, Agent, or Firm*—Jenkens & Gilchrist

(57) ABSTRACT

A plastic ball grid array package is designed to pass the JEDEC Level 1 Moisture Sensitivity Test (the "popcorn test"). The plastic ball grid array design minimizes contact between a mold compound/encapsulate/glob top and metal surfaces. The present plastic ball grid array design maximizes contact between the mold compound/encapsulate/glob top and either the laminate core or the solder resist in order to take advantage of this strong bond which will help disable delamination. Furthermore, solder resistive material overlaps the interface between metal surfaces and the laminate core.

27 Claims, 6 Drawing Sheets

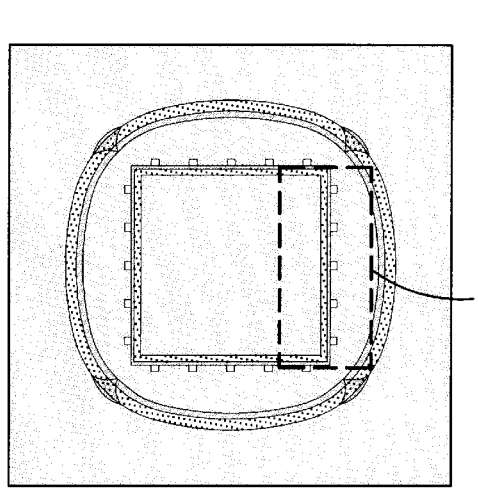
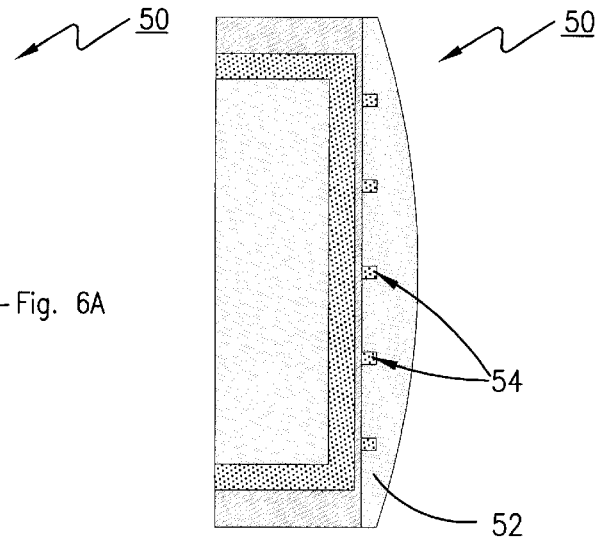
FIG. 6　　　　　FIG. 6A
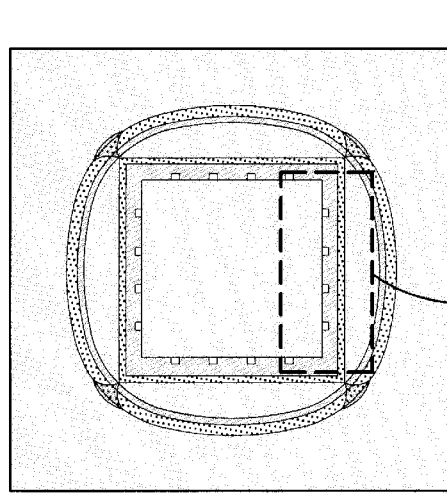
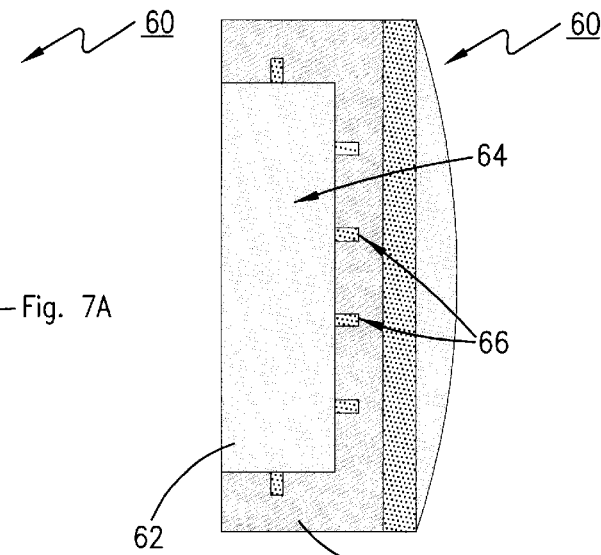
FIG. 7　　　　　FIG. 7A

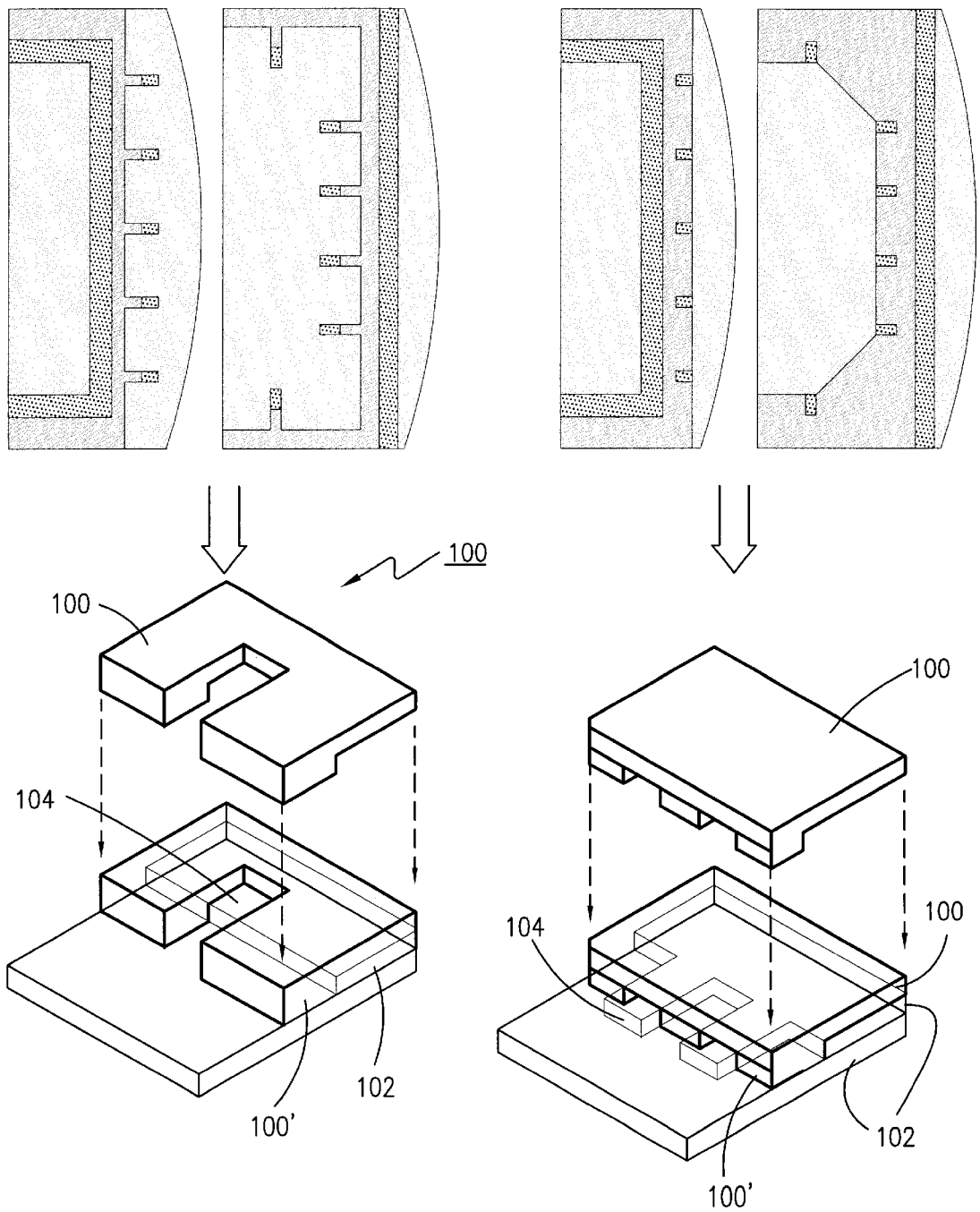
*FIG. 11*  *FIG. 12*

PLASTIC BALL GRID ARRAY PACKAGE FOR PASSING JEDEC LEVEL 1 MOISTURE SENSITIVITY TEST

BACKGROUND OF THE PRESENT INVENTION

1. Field of the invention

The present invention relates generally to integrated circuit carriers and in particular to plastic ball grid array carriers and chip-scale-packaging that is relatively insensitive to delamination when subjected to a moisture sensitivity test commonly referred to as a "popcorn test".

2. Description of Related Art

In a conventional plastic ball grid array (PBGA) package a silicon die is mounted on a die pad of a multilayer organic substrate. The entire die pad area of the substrate is coated with an adhesive which bonds the silicon die to the substrate.

Fractures created in the adhesive material, or delamination at the adhesive-substrate interface are the most common causes of PBGA package failure. Such a failure is very common in the "popcorn" test which is a moisture sensitivity test. Conventional PBGA packages can only pass the Institute for Interconnecting and Packaging Electronic Circuits (IPC) and the Joint Election Device Engineering Council (JEDEC) Level 3 Moisture Sensitivity Test. Some advanced PBGA packages can pass the Level 2 Moisture Sensitivity Test, but the Level 1 Moisture Sensitivity Test remains extremely challenging.

The IPC/JEDEC Moisture Sensitivity Test (the popcorn test) has 3 levels. Level 3 Moisture Sensitivity requires that the PBGA package be subjected to 30° C. at 60% relative humidity for 192 hours, then cycled through three IR/convection heating cycles which follow specific requirements. Level 2 Moisture Sensitivity requires that the PBGA package be subjected to 85° C. at 60% relative humidity for 168 hours and then cycled through three IR/convection heating cycles. Level 1, which is the highest level of moisture insensitivity, requires that the PBGA package be subjected to 85° C. at 85% relative humidity for 168 hours, then subjected to three cycles of IR/convection heating (See JEDEC document No. JESD22-A112-A *Moisture-Induced Stress Sensitivity for Plastic Surface Mount Devices*).

Moisture inside a plastic PBGA package turns to steam and expands rapidly when the package is exposed to the high temperatures of VPR (vapor phase reflow), IR (infrared) soldering, or, if the package is submerged in molten solder, wave soldering. Under certain conditions, the pressure from the expanding moisture and steam can cause internal delamination of the plastic from the chip and/or substrate, internal cracks that do not extend to the outside of the package, band damage, wire necking, bond lifting, thin film cracking, or cratering beneath the bonds. In the most severe case, the stress can result in external package cracks. This is commonly referred to as the "popcorn" phenomenon because the internal stress causes the package to bulge and then crack with an audible "pop" sound. Surface mount devices (SMD) such as PBGA packages are more susceptible to this problem than through-hole parts because they are exposed to higher temperatures during reflow soldering. The reason for this is that the soldering operation must occur on the same side of the circuit board as the surface mount device. For through-hole devices, the soldering operation occurs under the circuit board, which shields the through-hole devices from the hot solder. Also generally, SMDs have a smaller minimum plastic thickness from the chip or mount pad interface to the outside of the plastic package.

Various techniques have been used to either limit the amount of humidity a PBGA package is subjected to between manufacturing of the package and the time of soldering to a printed circuit card. Techniques have also been used to help the PBGA package to pass higher levels of the popcorn test.

To limit the amount of moisture a PBGA package is subjected to prior to soldering to a printed circuit board, PBGA packages are packed and shipped in hermetic bags to prevent the absorption of moisture from the environment. For PBGA packages that are not packed in hermetic bags or that have been subjected to the environment for sometime, it is an industry standard to bake dry the packages before surface mounting. The additional steps of either placing the PBGA packages in hermetic bags, or baking them increases the manufacturing cost of a device or a product.

Another technique that has been used to increase a PBGA package's resistance to a popcorn failure has been to increase the adhesion strength between the PBGA substrate and the die. One approach has been to formulate encapsulating materials and die-attachment materials with high adhesion strength. Still yet another technique for further increasing adhesion between, for example, the substrate and the encapsulating material is to clean the PBGA package with a plasma process before encapsulation, or to chemically modify the substrate surface via graft co-polymerization. These techniques, which do increase adhesion, all require extra steps and generally add additional production costs.

Another technique that has been used to prevent popcorn package cracking is to incorporate minute through-holes in the substrate in the area directly below the die-attach adhesive material and the chip. The through-holes provide a path for some of the vaporizing moisture to escape at solder flow temperatures thereby avoiding a pressure build-up and potential popcorn cracking. A drawback with this technique is that the die may not be completely sealed from environmental elements and contaminants.

What is needed is a low or no-additional-cost method and structure for providing a plastic BGA package that can meet the IPC/JEDEC Level 1 Moisture Sensitivity Test. An ideal structure or method should not add cost-increasing steps or cost-increasing materials to the manufacture of PBGA packages or assembly of PBGA packages onto a circuit board.

SUMMARY OF THE INVENTION

The present exemplary embodiments of the present invention provide a plastic ball grid array (PBGA) package that can pass the IPC, EIA/JEDEC Level 1 Moisture Sensitivity Test, commonly referred to as the "popcorn test" by providing a PBGA package that incorporates one or more design features which (1) maximize the strong interfacial contact between encapsulant (mold compound, glob top, etc.) and the laminate core (BT, FR4, etc.); (2) minimize the weak interfacial contact between encapsulant (mold compound, glob top, etc.) and metal (gold-plated copper); and (3) extend the solder mask material to overlap both the metal and laminate core at the metal/laminate core interface.

BRIEF DESCRIPTION OF THE DRAWINGS

Various objects and advantages of this invention will become apparent and more readily appreciated from the following description of the presently preferred exemplary embodiments, taken in conjunction with the accompanying drawings, of which:

FIGS. 6 and 6A depict another exemplary PBGA package having a solder resistive material covering the power ring except for predetermined wire bonding locations;

FIGS. 7 and 7A depict an exemplary PBGA package having a solder mask over a die pad and having bonding fingers extending from the die pad;

FIGS. 11 and 12 depict exemplary isometric views of exemplary layers of materials in a surface mountable package wherein the solder masking material overlaps the metal trace and the laminate core.

DETAILED DESCRIPTION OF THE PRESENTLY PREFERRED EXEMPLARY EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
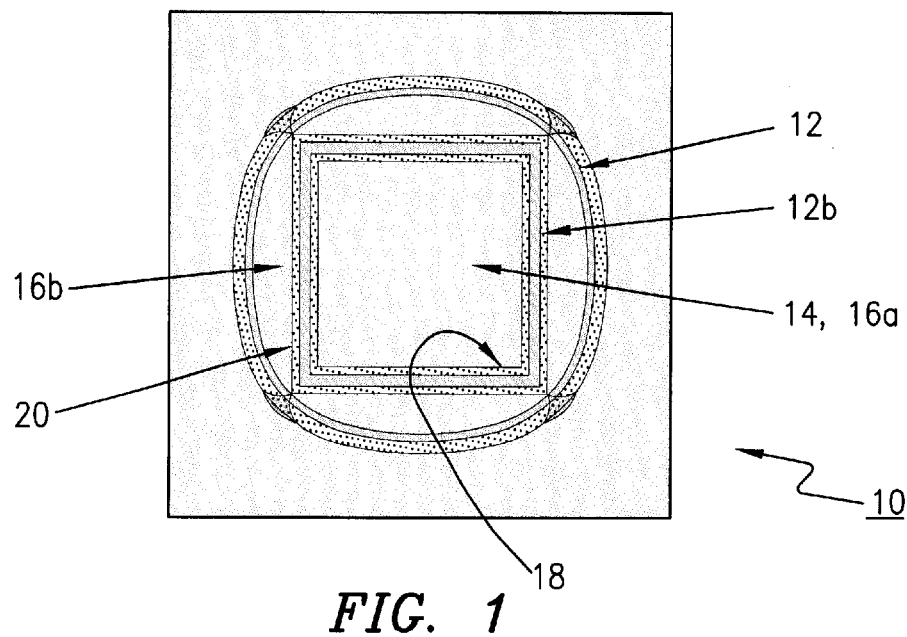
FIG. 1 depicts a prior art PBGA package.
Figure 2:
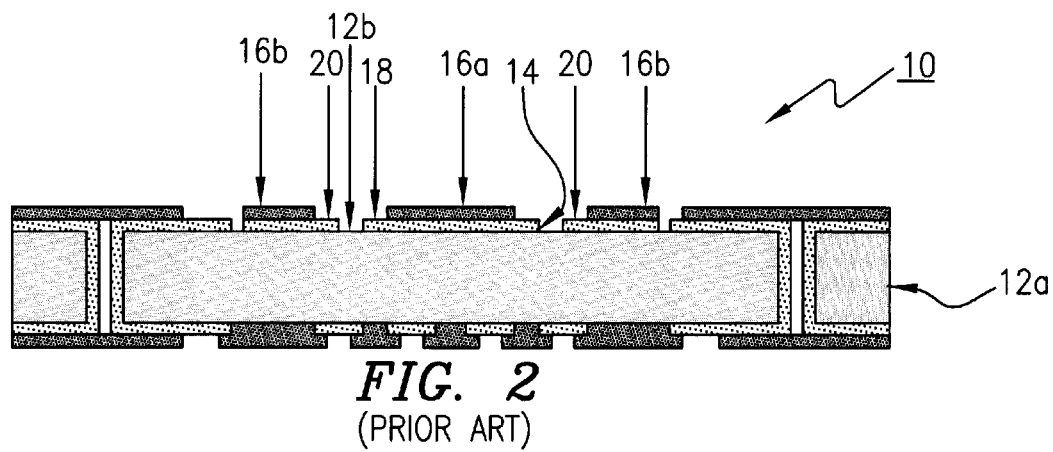
FIG. 2 depicts a side view of a prior art PBGA package.
Figure 3:
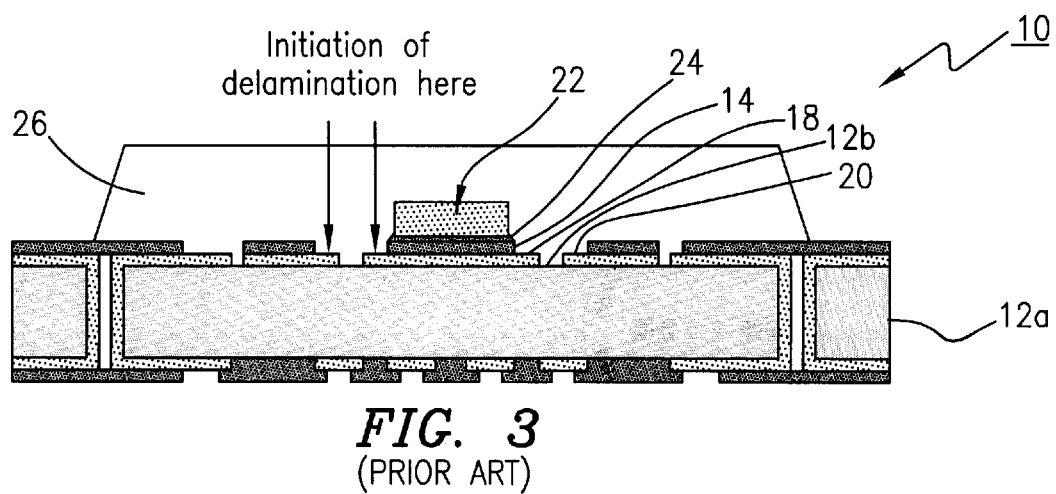
FIG. 3 depicts a side view of a prior art PBGA package having a die installed and a mold compound or encapsulation material covering the die.

Referring first to FIGS. 1, 2 and 3, wherein conventional or prior art PBGA packages 10 are depicted. A conventional PBGA package has a laminate core/substrate 12. Substantially in the center of the PBGA package 10 is a die pad 14 that is covered with a solder mask 16a. The die pad may be made of copper or another conductive metal. The solder mask 16a covers the die pad 14 so that a continuous square grounding portion (ground ring) 18 is exposed about the die pad 14. The ground ring 18 may be gold plated. The exposed substrate 12b is exposed in an area about and around the grounding portion 18. A continuous square shaped power plane 20 extends about and around the square ground portion 18 and the exposed substrate 12b. The square power plane is on top of the substrate 12a, but next to the exposed substrate 12b. Solder mask 16b may be placed on top of the square power portion 20 to create a continuous square power plane 20 to which bond wires can be connected to at a later time.

FIG. 3 further depicts a die (integrated circuit) 22 that is attached to the die pad 14 via a die-attach substance 24. The die attach substance may be an adhesive or polymer compound. A mold compound, encapsulant, or glob top 26 is installed over the die 22, the square ground portion 20, the square power portion 20 the solder mask material 16 and the substrate 12.

A drawback of the PBGA package, depicted in FIGS. 1, 2 and 3, and shown particularly in FIG. 3, is that during the popcorn test or during solder reflow of the PBGA package delamination occurs between the mold compound 26 and the ground portion 18 or between the mold compound 26 and the power portion 20 or the die 22 and the die pad 14. The result of the delamination is package failure or the package cracking during solder reflow. As the temperature rapidly increases inside the PBGA package and water absorbed by the PBGA package rapidly turns to steam pressure causes the delamination. Another reason, the delamination occurs is due to the weak bond established between the encapsulant and the metal surface of the ground or power portions.

Still another reason the delamination occurs is due to the limited amount of area utilizing the strong contact/bond between the encapsulant and the laminate core or the encapsulant and the solder resistive material.

The present invention enables a PBGA package to pass the most difficult, Level 1, Moisture Sensitivity Test by incorporating one or several design features into a PBGA package. The features discussed can be incorporated into any PBGA package design whether wire bonding or flip-chip bonding techniques are used. The design features seek to maximize the strong interfacial contact between the encapsulant (mold compound or "glob top") and the laminate core (BT, FR4, etc.). The design features further seek to minimize the amount of weak interfacial between the encapsulant and any metal traces such as the gold plated copper ground or power rings. The exemplary design features further may also increase the amount of solder masking used by extending the solder mask to overlap the metal traces and cover more of the laminate core.

Referring now to FIGS. 4, 4A, 5, 5A, 6 and 6A, these figures depict exemplary embodiments of the present invention which greatly decrease the initiation of delamination of the encapsulate from the power traces.

Figure 4:
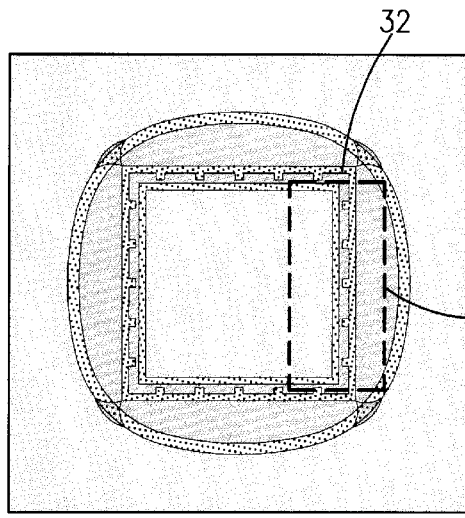
FIGS. 4 and 4A depict an exemplary PBGA package having a minimized power ring.
Figure 4A:
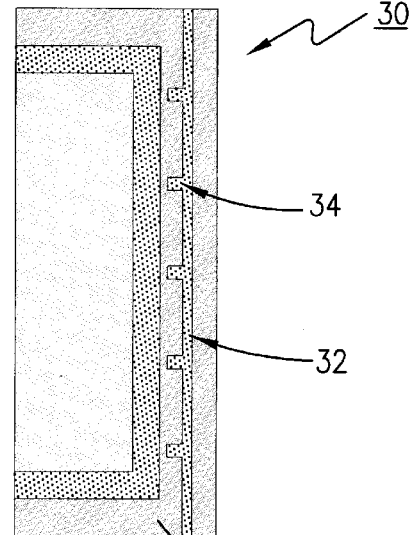

In particular, FIGS. 4 and 4A depict view and a "zoom-in" view of an exemplary PBGA package 30 wherein the power trace 32 is reduced and includes bond fingers 34. The bond fingers 34 can take any reasonable shape, rectangle, triangle, circle, or square so long as they are sufficient for wire bonding. By making the power trace 32 thin and minimizing the size of wire bonding locations the weak bond between the encapsulate (not shown) and the metal power trace 32 is minimized in favor of a maximization of the strong bond between the encapsulate and the laminate core 36.

Figure 5:
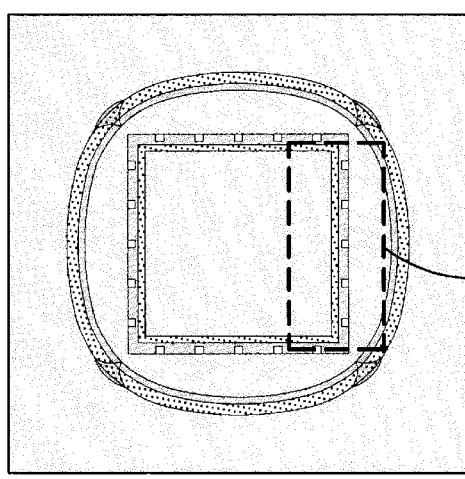
FIGS. 5 and 5A depict another exemplary PBGA package having a solder resistive material covering the power ring with bonding fingers exposed.
Figure 5A:
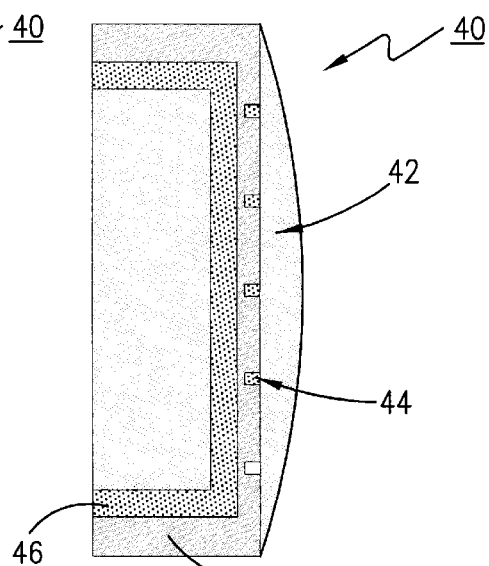

In FIGS. 5 and 5A a view and zoom-in view of another exemplary PBGA package 40 is depicted. Here the power trace is covered with solder mask 42 and a bonding fingers 44 extend out from the power trace toward the grounding trace 46. The bonding finger 44 is large enough to bond a wire to it and can be any practical shape. The bonding finger is on top of the laminate 48.

This configuration minimizes the weaker encapsulate power trace interface to only the wire bonding locations 44. Furthermore, this configuration maximizes a strong encapsulate to laminate and/or encapsulate to solder resist bonds.

FIGS. 6 and 6A depict another exemplary embodiment of a PBGA package 50 wherein the entire power trace is covered with solder resistant material 52 except for predetermined wire bonding locations 54. The wire bonding locations can be gold plated. This embodiment minimizes the weak metal to encapsulate bond in favor of a stronger metal to solder mask to encapsulate bond.

Now focusing on the die pad and ground trace, or ground ring, the following embodiments include features and elements that inhibit the delamination of the ground traces. Referring to FIGS. 7 and 7A an exemplary PBGA package 60 is depicted wherein the die pad 62 is substantially in the middle of the package. The wire bonding fingers 66 and the die pad 62 are on top of the laminate core 68. There are wire bonding fingers 66 extending out from the die pad 64. The wire bonding fingers 66 can be any usable shape, but should be only as large as necessary for wire bonding. Using this exemplary configuration the strongly bonded area between the mold compound (not shown here) and the laminate core 68 is maximized and the compound/metal interface is minimized thereby increasing the delamination strength of the PBGA package 60.

Figure 8:
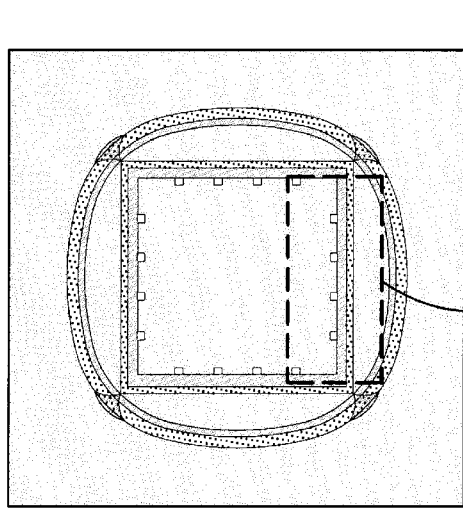
FIGS. 8 and 8A depicts an exemplary PBGA package having a solder mask over the ground metal/die pad with the exception of predetermining bonding locations on the periphery of the die pad.
Figure 8A:
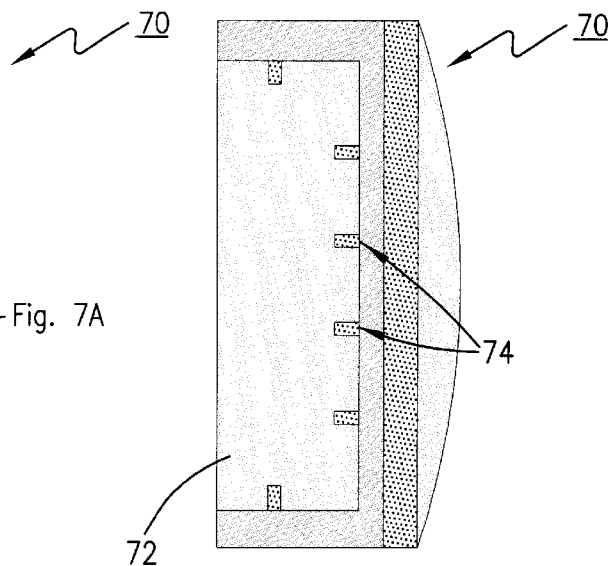

FIGS. 8 and 8A depict another exemplary PBGA package 70. In this configuration, the die pad 72 is completely covered with solder mask except for predetermined locations about the periphery of the die pad 72 thereby establishing wire bonding locations 74. By only allowing the wire bond locations 74 to come in contact with the mold compound the weak bond established therebetween is minimized. The stronger bond between the solder mask and the mold compound is maximized thereby making delamination of the die pad 72 (and ground plane) less likely.

Figure 9:
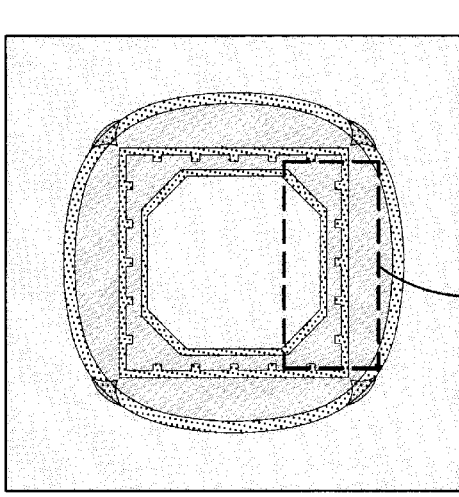
FIGS. 9 and 9A depict an exemplary PBGA package having chamfered corners on the periphery of the die pad and ground ring.
Figure 9A:
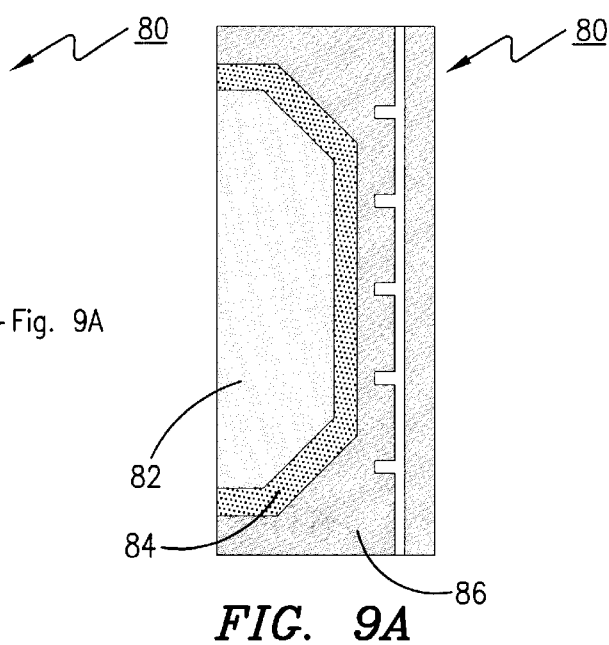

FIGS. 9 and 9A depict another embodiment of an exemplary PBGA package 80 wherein die pad 82 has a chamfered or beveled edge 84. By chamfering the edge more laminate surface 86 can be placed in direct contact with the mold compound. Furthermore, by removing the 90° squared corner of the die pad it has been determined the delamination at the reduced angled corners is less likely.

Figure 10:
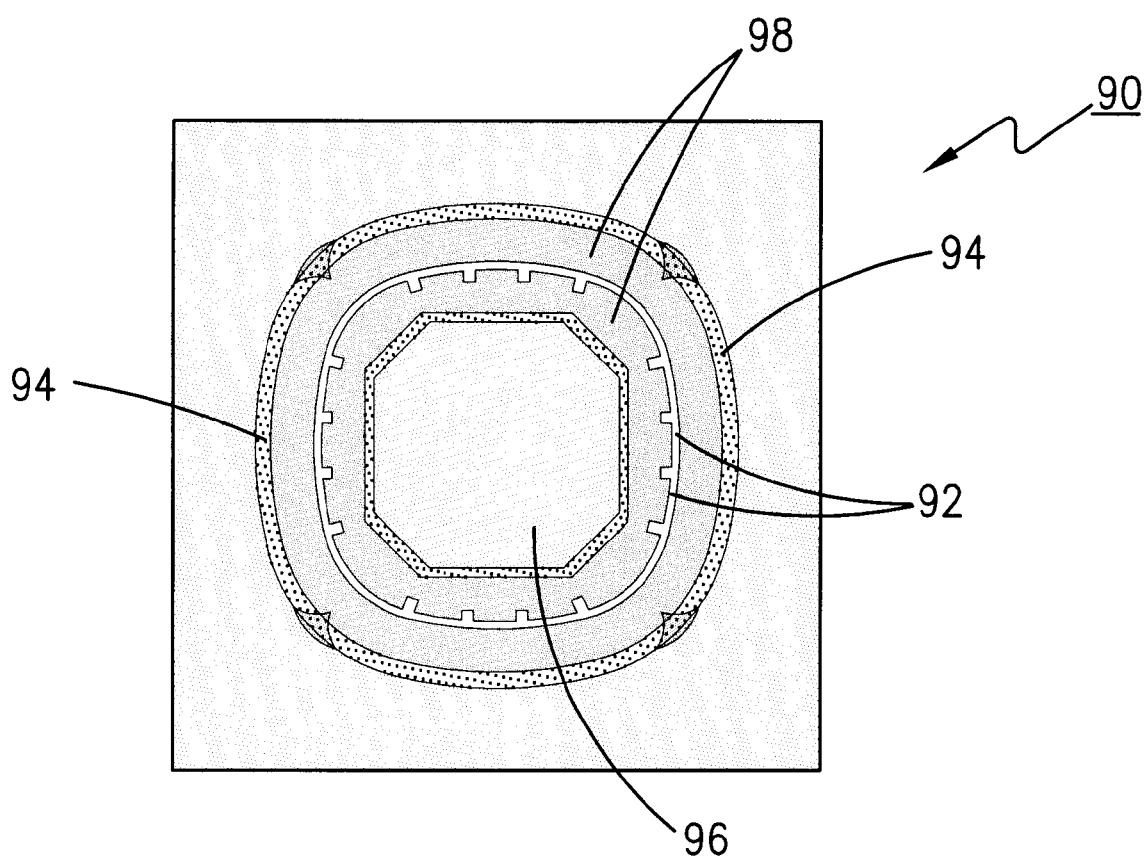
FIG. 10 depicts an exemplary PBGA package with a chamfered ground ring and a chamfered power ring with distributed bonding locations such that the power ring is substantially positioned halfway between the stitch bond and the ground ring.

FIG. 10 depicts another embodiment of the present invention wherein a PBGA package 90 is designed to resist delamination by substantially centering the power trace 92 between the stitch bond 94 and the die pad 96. The substantial centering of power trace 92 between the stitch bond 94 and the die pad 96 substantially equalizes the contact area of the encapsulate/mold compound with the laminate core surface 98 on either side of the power trace 92. This configuration increases the strength of the PBGA package and further inhibits delamination.

Further, FIG. 10 depicts the power trace 92 to be very thin with a plurality of wire bonding locations. The geometry of the power trace is also chamfered to remove sharp corners from the trace because of a sharp corner's tendency to delaminate under stress.

FIGS. 11 and 12 depict isometric views of portions of two exemplary PBGA packages. In particular, FIGS. 11 and 12 depict how solder mask material 100 can be extended over the edge of a copper trace 102 (power or ground) in order to create a wire bonding finger 104, and to extend and overlap a portion of the laminate core. Thus, the solder mask 100' covers all of the top side and edge of the copper trace except were the wire bonding finger is established.

A solder mask to laminate core bond is stronger than a solder mask to copper bond. By extending the solder mask 100 onto the laminate core in this overlapping manner it will further hold the copper trace in place and further reduce the risk of a delamination of the copper trace along the copper to solder mask-to-laminate core interface.

Various advantages are accomplished by one or more combinations of the above exemplary embodiments of a PBGA package. First, the exemplary embodiments require a minimal inexpensive design change to the standard/prior art PBGA packages. Furthermore, the present assembly process used to manufacture a PBGA package can still be employed to produce a PBGA package with a high level of reliability. It is believed that no additional cost is added to the manufacture of exemplary PBGA packages because no new materials or special steps are required above and beyond those of the standard PBGA package shown in FIG. 1.

The exemplary PBGA packages provide enhanced reliability performance by being able to pass the Level 1 Moisture Sensitivity Test. Thus, less stringent requirements for shipping and packaging the PBGA packages are required of a manufacturer utilizing the exemplary PBGA packages. No hermetic packaging is required for shipments and no extra drying steps are required prior to reflow soldering. Thus, the cost of using the exemplary PBGA packages in circuit board designs is reduced over prior PBGA packages.

The exemplary PBGA package embodiments enhance the package integrity of the overall PBGA package, and in particular enable the PBGA package to pass the IPC/JEDEC Level 1 Moisture Sensitivity Test. This adds the following advantages. Under the JEDEC and the IPC, when a package passes the Level 1 Moisture Sensitivity Test it is said to have an infinite production floor life and, thus, does not have to be stored in special low humidity conditions or used in a solder reflow process within a limited amount of time. Furthermore, there is a very low to negligible risk of the PBGA package failing by "popcorn" package cracking. The exemplary PBGA packages don't need to be kept in hermetic containers or to be pre-baked before a surface mounting process. All of these enhancements result in a lowered manufacturing cost to the manufacturer of surface mounted components on circuit boards.

Although various preferred embodiments of the invention have been shown and described, it will be appreciated by those skilled in the art that changes may be made to these embodiments without departing from the principles and the spirit of the invention, the scope of which is defined in the appended claims.

What is claimed is:

1. An integrated circuit package comprising:

a laminate core having a top surface and a bottom surface;

a die pad positioned on said top surface of said laminate, said die pad being covered with a first solder resistant material except for at least one location about the perimeter of said die pad, said at least one location providing a metal bonding location;

a conductive trace on top of said laminate core, said conductive trace being completely about said die pad, said conductive trace being substantially covered with a second solder resistant material except for at least two discrete wire bonding locations on said conductive trace, wherein said at least two wire bonding locations are minimized to a size just large enough to bond a wire thereto;

an encapsulation compound on top of said die pad, said lamination core, said conductive trace, said first solder resistant material, and said second solder resistant material; said encapsulation compound being in contact with said metal bonding location at said at least one location, said encapsulation compound being in contact with said conductive trace only at each of said at least one wire bonding location.

2. The integrated circuit package of claim 1, wherein said at least one location about said perimeter of said die pad is a ground wire bonding location that extends outward from the perimeter of said die pad.

3. The integrated circuit of claim 1, wherein said first solder resistant material overlaps said die pad and further covers a portion of said laminate core about said die pad.

4. The integrated circuit of claim 1, wherein said second solder resistant material overlaps said conductive trace and covers a portion of said laminate core about said conductive trace.

5. The integrated circuit of claim 1, wherein said die pad has a first sidewall that meets with a second sidewall at an angle of greater than 90 degrees.

6. The integrated circuit of claim 1, further comprising a stitch bond portion on top of said laminate and about, but not in contact with, said conductive trace; said conductive trace being spaced substantially an equal distance between said stitch bond portion and said die pad.

7. The integrated circuit package of claim 1, wherein said integrated circuit package is adapted to pass a JEDEC Level 1 Moisture Sensitivity Test by minimizing contact between a mold compound and all metal traces, and by maximizing contact between said mold compound and at least one of said laminate core and said solder resistant material.

8. The integrated circuit package of claim 1, wherein said integrated circuit package passes a JEDEC Level 1 Moisture Sensitivity Test.

9. The integrated circuit package of claim 1, wherein said integrated circuit package passes a JEDEC Level 2 Moisture Sensitivity Test.

10. The integrated circuit package of claim 1, wherein said integrated circuit package passes a JEDEC Level 3 Moisture Sensitivity Test.

11. The integrated cirucuit package of claim 1, wherein said integrated circuit package is a plastic ball grid array package.

12. An integrated circuit package comprising:

a laminate core having a top surface and a bottom surface;

a die pad positioned on said top surface of said laminate, said die pad being covered with a first solder resistant material except for at least one location about the perimeter of said die pad, said at least one location providing a metal bonding location;

a conductive trace on top of said laminate core, said conductive trace being completely about said die pad, said conductive trace being substantially covered with a second solder resistant material except for at least one predetermined wire bonding location on said conductive trace;

an encapsulation compound on top of said die pad, said lamination core, said conductive trace, said first solder resistant material, and said second solder resistant material; said encapsulation compound being in contact with said metal bonding location at said at least one location, said encapsulation compound being in contact with said conductive trace only at each of said at least one wire bonding location; and wherein said conductive trace includes at least one wire bonding finger extending from said conductive trace and being on top of said laminate core; said second solder resistant material covering said conductive trace except said at least one wire bonding finger, said at least one wire bonding finger being said at least one wire bonding location.

13. A plastic ball grid array package comprising:

a laminate core having a top surface and a bottom surface;

a die pad on top of said top surface of said laminate core, said die pad having a first solder resistive layer on top of said die pad such that a portion, about the perimeter of said die pad, can be used as a first set of wire bonding locations;

a conductive trace, on top of said laminate core, spaced from the perimeter of said die pad and extending completely about said die pad; said conductive trace comprising a second set of wire bonding locations in the form of bonding fingers, said bonding fingers being minimized to a size just large enough for a wire bonding procedure.

14. The plastic ball grid array package of claim 13, wherein said conductive trace has a second solder resistive covering except on said second set of wire bonding locations.

15. The plastic ball grid array package of claim 14, wherein said second set of wire boding locations extend from said conductive trace and are on top of said laminate core.

16. The plastic ball grid array package of claim 15, wherein said second solder resistive covering overlaps the edges of said conductive trace, except in locations, and covers a portion of said laminate core that is next to said conductive trace.

17. The plastic ball grid array package of claim 14, wherein said first set of wire bonding locations is a continuous conductive area about the perimeter of said die pad.

18. The plastic ball grid array package of claim 14, wherein said first set of wire bonding locations is a plurality of discrete wire bonding locations about the perimeter of said die pad.

19. The plastic ball grid array package of claim 14, wherein said first set of wire bonding locations comprises a plurality of wire bonding fingers extending outwardly from said die pad on top of said laminate core.

20. The plastic ball grid array package of claim 14, wherein said die pad comprises a first sidewall that intersects a second sidewall at an angle greater than 90 degrees.

21. The plastic ball grid array package of claim 14, further comprising a stitch bond portion on top of said laminate core and outside the perimeter of said conductive trace, said conductive trace being positioned substantially halfway between said stitch bond portion and said die pad.

22. The plastic ball grid array package of claim 14, wherein said first solder resistive layer overlaps the edge of said die pad and covers a portion of said laminate core at locations along the perimeter of said die pad.

23. The plastic ball grid array package of claim 14, further comprising an encapsulation compound covering said die pad, said conductive trace, said laminate core, and said first solder resistive material; said encapsulate compound being in contact with said first set of wire bonding locations and said second set of wire bonding locations.

24. The plastic ball grid array package of claim 14, wherein said plastic ball grid array passes a JEDEC Level 1 Moisture Sensitivity test due to, at least in part, by limiting the contact between the encapsulation compound and any metal to only said first set of wire bonding locations and said second set of wire bonding locations and by maximizing the contact between the encapsulation compound and any non-metal including at least one of said laminate core, and said solder resistive layer.

25. The plastic ball grid array of claim 14, wherein said plastic ball grid array passes a JEDEC Level 1 Moisture Sensitivity Test.

26. The plastic ball grid array of claim 14, wherein said plastic ball grid array passes a JEDEC Level 2 Moisture Sensitivity Test.

27. The plastic ball grid array of claim 14, wherein said plastic ball grid array passes a JEDEC Level 3 Moisture Sensitivity Test.

* * * * *

UNITED STATES PATENT AND TRADEMARK OFFICE
CERTIFICATE OF CORRECTION

PATENT NO. : 6,424,047 B1
DATED : July 23, 2002
INVENTOR(S) : Yong Chua TEO et al.

It is certified that error appears in the above-identified patent and that said Letters Patent is hereby corrected as shown below:

<u>Title Page,</u>
Item [75], Inventor's, replace "Teo Yong Chua" with -- Yong Chua TEO --;
Replace "Wong Ee Hua" with -- Ee Hua WONG --; and
Replace "Teo Poi Siong" with -- Poi Siong TEO --.

Signed and Sealed this

Thirty-first Day of December, 2002

JAMES E. ROGAN
*Director of the United States Patent and Trademark Office*